(12) United States Patent
Mazzillo et al.

(10) Patent No.: US 12,289,930 B2
(45) Date of Patent: Apr. 29, 2025

(54) INTEGRATED PHOTODETECTING SEMICONDUCTOR OPTOELECTRONIC COMPONENT

(71) Applicant: ams-OSRAM International GmbH, Regensburg (DE)

(72) Inventors: Massimo Cataldo Mazzillo, Hamburg (DE); Wolfgang Zinkl, Tegernheim (DE)

(73) Assignee: ams-OSRAM International GmbH, Regensburg (DE)

( * ) Notice: Subject to any disclaimer, the term of this patent is extended or adjusted under 35 U.S.C. 154(b) by 517 days.

(21) Appl. No.: 17/798,059

(22) PCT Filed: Feb. 5, 2021

(86) PCT No.: PCT/EP2021/052820
§ 371 (c)(1),
(2) Date: Aug. 5, 2022

(87) PCT Pub. No.: WO2021/156447
PCT Pub. Date: Aug. 12, 2021

(65) Prior Publication Data
US 2023/0084888 A1    Mar. 16, 2023

(30) Foreign Application Priority Data
Feb. 6, 2020    (DE) .................. 10 2020 201 453.1

(51) Int. Cl.
*H10F 77/30*    (2025.01)
*G01S 7/481*    (2006.01)
(Continued)

(52) U.S. Cl.
CPC .......... *H10F 77/337* (2025.01); *G01S 7/4814* (2013.01); *G01S 7/4816* (2013.01);
(Continued)

(58) Field of Classification Search
None
See application file for complete search history.

(56) References Cited

U.S. PATENT DOCUMENTS

| | | | |
|---|---|---|---|
| 5,463,494 A | 10/1995 | Hobrock | |
| 12,009,439 B2 * | 6/2024 | Mazzillo | ............... H10F 77/953 |

(Continued)

FOREIGN PATENT DOCUMENTS

| | | |
|---|---|---|
| CN | 101853675 A | 10/2010 |
| CN | 104301647 A | 1/2015 |

(Continued)

OTHER PUBLICATIONS

International Search Report issued on May 28, 2021, for corresponding International Patent Application No. PCT/EP2021/052820.

(Continued)

*Primary Examiner* — Michael Lebentritt
(74) *Attorney, Agent, or Firm* — Hauptman Ham, LLP (57) ABSTRACT

An integrated photodetecting semiconductor optoelectronic component for measuring the intensity of each of the two colour constituents of dichromatic light irradiating the optoelectronic component includes a first SPAD and a second SPAD that detect photons over a broad range of wavelengths. The component also includes a semiconductor optical longpass filter that at least partially covers an active surface area of the first SPAD. The longpass filter is permissive to a first one of the two colour constituents of the dichromatic light and blocking the second one of the two colour constituents of the dichromatic light. The component further includes electronic circuitry for the readout and processing of detection signals delivered by the first and second SPAD. The electronic circuitry is adapted to provide a first intensity output signal and a second intensity output (Continued)

signal via a differential analysis based on the detection signals delivered by the first and second SPAD.

12 Claims, 6 Drawing Sheets

(51) Int. Cl.
  *G01S 7/4865* (2020.01)
  *G01S 17/894* (2020.01)
  *G02B 5/20* (2006.01)
  *G02B 27/14* (2006.01)
  *H10F 30/21* (2025.01)
  *H10F 30/225* (2025.01)
  *H10F 77/00* (2025.01)
  *G02B 5/28* (2006.01)

(52) U.S. Cl.
  CPC .......... *G01S 7/4817* (2013.01); *G01S 7/4865* (2013.01); *G01S 17/894* (2020.01); *G02B 5/207* (2013.01); *G02B 5/208* (2013.01); *G02B 27/14* (2013.01); *H10F 30/225* (2025.01); *H10F 30/288* (2025.01); *H10F 77/331* (2025.01); *H10F 77/959* (2025.01); *G02B 5/28* (2013.01)

(56) References Cited

U.S. PATENT DOCUMENTS

| | | | |
|---|---|---|---|
| 2006/0199260 A1* | 9/2006 | Zhang | C12M 23/34 435/293.1 |
| 2008/0179701 A1 | 7/2008 | Lin et al. | |
| 2011/0068255 A1 | 3/2011 | Zheng et al. | |
| 2012/0313201 A1 | 12/2012 | Hebert et al. | |
| 2013/0020491 A1* | 1/2013 | Mazzillo | H10F 30/2275 257/434 |
| 2013/0083315 A1* | 4/2013 | Lo | G01J 3/46 356/402 |
| 2013/0112855 A1 | 5/2013 | McLeod | |
| 2015/0116672 A1 | 4/2015 | Woltman et al. | |
| 2016/0293858 A1* | 10/2016 | Brandt | H10K 85/30 |
| 2018/0027196 A1 | 1/2018 | Yang et al. | |
| 2018/0308881 A1 | 10/2018 | Hynecek | |
| 2018/0333060 A1* | 11/2018 | Mazzillo | A61B 5/02433 |
| 2018/0364095 A1 | 12/2018 | Nagaya et al. | |
| 2019/0320128 A1 | 10/2019 | Lee | |

FOREIGN PATENT DOCUMENTS

| | | | | |
|---|---|---|---|---|
| CN | 105683807 A | 6/2016 | | |
| CN | 105895645 A | 8/2016 | | |
| CN | 107885023 A | 4/2018 | | |
| CN | 108227059 A | 6/2018 | | |
| EP | 2 407 760 A1 | 1/2012 | | |
| EP | 3 301 509 A1 | 4/2018 | | |
| WO | WO-2006037022 A2 * | 4/2006 | ........ | B01L 3/502723 |
| WO | 2017/172030 A1 | 10/2017 | | |
| WO | WO-2019012514 A1 * | 1/2019 | ......... | A61K 49/0054 |

OTHER PUBLICATIONS

Written Opinion issued on May 28, 2021, for corresponding International Patent Application No. PCT/EP2021/052820.

Zhu et al., "Fluorescence Multiplexing with Time-Resolved and Spectral Discrimination Using a Near-IR Detector", Analytical Chemistry, May 15, 2003, vol. 75, No. 10, pp. 2280-2291, Cited in NPL Nos. 1 and 2.

Sengupta et al., "An All-Digital CMOS Ambient Light Sensor using a Single Photon Avalanche Diode", 2017 IEEE Sensors, 2017, pp. 1-3.

* cited by examiner

INTEGRATED PHOTODETECTING SEMICONDUCTOR OPTOELECTRONIC COMPONENT

CROSS REFERENCE TO RELATED APPLICATION

This application is a National Stage of International Application No. PCT/EP2021/052820, filed on Feb. 5, 2021, which designates the United States and was published in Europe, and which is based upon and claims priority to German Patent Application No. DE 10 2020 201 453.1, filed on Feb. 6, 2020 in the German Patent Office. Both of the aforementioned applications are hereby incorporated by reference in their entireties.

The present disclosure also pertains to optoelectronic photodetecting components, which are widely used as part of electronic devices, such as smart phones, wearables, tablets, displays and the like. Such components/optical sensors can extend the functionality and/or help improve the operation of the electronic device into which they are integrated.

It would be desirable to enhance these known optical sensors so that they become able to simultaneously and rapidly detect faint light signals in two different wavelength ranges. Rapid, simultaneous and highly sensitive detection in the near infrared and in the blue/ultraviolet range would be particularly desirable since it would make portable electronic devices equipped with such sensors better suited for use e.g. as optical spectrometers or vital signs monitors.

At the same time, these optical sensors should remain as simple, cheap and small as possible. Otherwise, they would no longer be adapted for mass manufacture and integration into consumer devices.

It is thus an object of the present disclosure to provide an integrated photodetecting semiconductor optoelectronic component, which is able to measure the intensity of each of the two colour constituents of dichromatic light rapidly, reliably and simultaneously, while being easy to mass-manufacture.

According to the present disclosure, this object is achieved with an integrated photodetecting semiconductor optoelectronic component for measuring the intensity of each of the two colour constituents of dichromatic light irradiating the optoelectronic component, the component comprising:
  a first SPAD adapted to detect photons over a broad range of wavelengths, the first SPAD comprising an active surface area allowing photons to be detected to enter the first SPAD;
  a second SPAD adapted to detect photons over a broad range of wavelengths, the second SPAD being arranged next to the first SPAD;
  a semiconductor optical longpass filter that at least partially covers the active surface area of the first SPAD, the longpass filter being permissive to a first one of the two colour constituents of the dichromatic light and blocking the second one of the two colour constituents of the dichromatic light;
  electronic circuitry for the readout and processing of the detection signals delivered by the first and second SPAD, the electronic circuitry being adapted to provide:
    i) a first intensity output signal I1 indicative of the intensity of the first colour constituent, based on the detection signal delivered by the first SPAD; and
    ii) a second intensity output signal I2 indicative of the intensity of the second colour constituent, via a differential analysis based on the detection signals delivered by the first and second SPAD.

By using SPADs as the component's light detecting elements, the component benefits from the SPADs' inherent high sensitivity, large gain and rapid response. Thanks to the specific longpass filter in combination with the differential analysis of the electronic circuitry, the component is able to provide an accurate measure of the intensity of both colour constituents. Semiconductor materials such as polycrystalline silicon are readily available at semiconductor fabrication plants. Accordingly, the featured longpass filter and thus the present photodetecting optoelectronic component are easy to manufacture with a standard CMOS fabrication process.

According to preferred embodiments, the component of the present disclosure may include one, several or all of the following features, in all technically possible combinations:
  the longpass filter is a single layer of semiconductor material deposited above the active surface area of the first SPAD;
  the semiconductor material of the longpass filter is silicon, germanium, gallium arsenide or gallium nitride;
  the longpass filter doubles as a functional electric element that is part of an electric circuit;
  the semiconductor material of the longpass filter is doped so that the electrical material properties of the longpass filter are adapted to its additional role as said functional electric element;
  the longpass filter doubles as a passive quenching resistor for the first SPAD;
  the longpass filter has the shape of a meandering electrically conducting path that forms said passive quenching resistor;
  the meandering shape of the longpass filter defines a set of non-filtering interstices, and wherein said interstices are covered by an optical mask, preferably made of metal, which is opaque to the dichromatic light;
  the differential analysis carried out by the electronic circuitry to provide the second intensity output signal I2 comprises the steps of:
    determining a first photon detection rate N1 from the output signal delivered by the first SPAD;
    determining a second photon detection rate N2 from the output signal delivered by the second SPAD; and
    calculating the second intensity output signal I2 with the following formula:

$$I2 = a \times N2 - b \times N1$$

wherein a and b are constants, which are predetermined by the photon detection efficiencies of the first and second SPAD at the wavelengths corresponding to the two colour constituents;
  the electronic circuitry includes a time-to-digital converter for time-of-flight measurements;
  the first SPAD and the second SPAD have the same p-n-junction structure;
  the two colour constituents of the dichromatic light are near infrared light and near ultraviolet-blue light, respectively;
  one or more additional SPADs with one or more corresponding additional semiconductor optical longpass filters for measuring the intensity of one or more additional colour constituents of incident light.

The present disclosure also relates to a method of manufacturing an optoelectronic component as defined above.

The present disclosure also relates to an electronic device such as a smart phone, a gadget or a wearable, including an optoelectronic component as defined above.

Preferred embodiments of the present disclosure will now be described in detail with reference to the accompanying drawings, in which.

Figure 1:
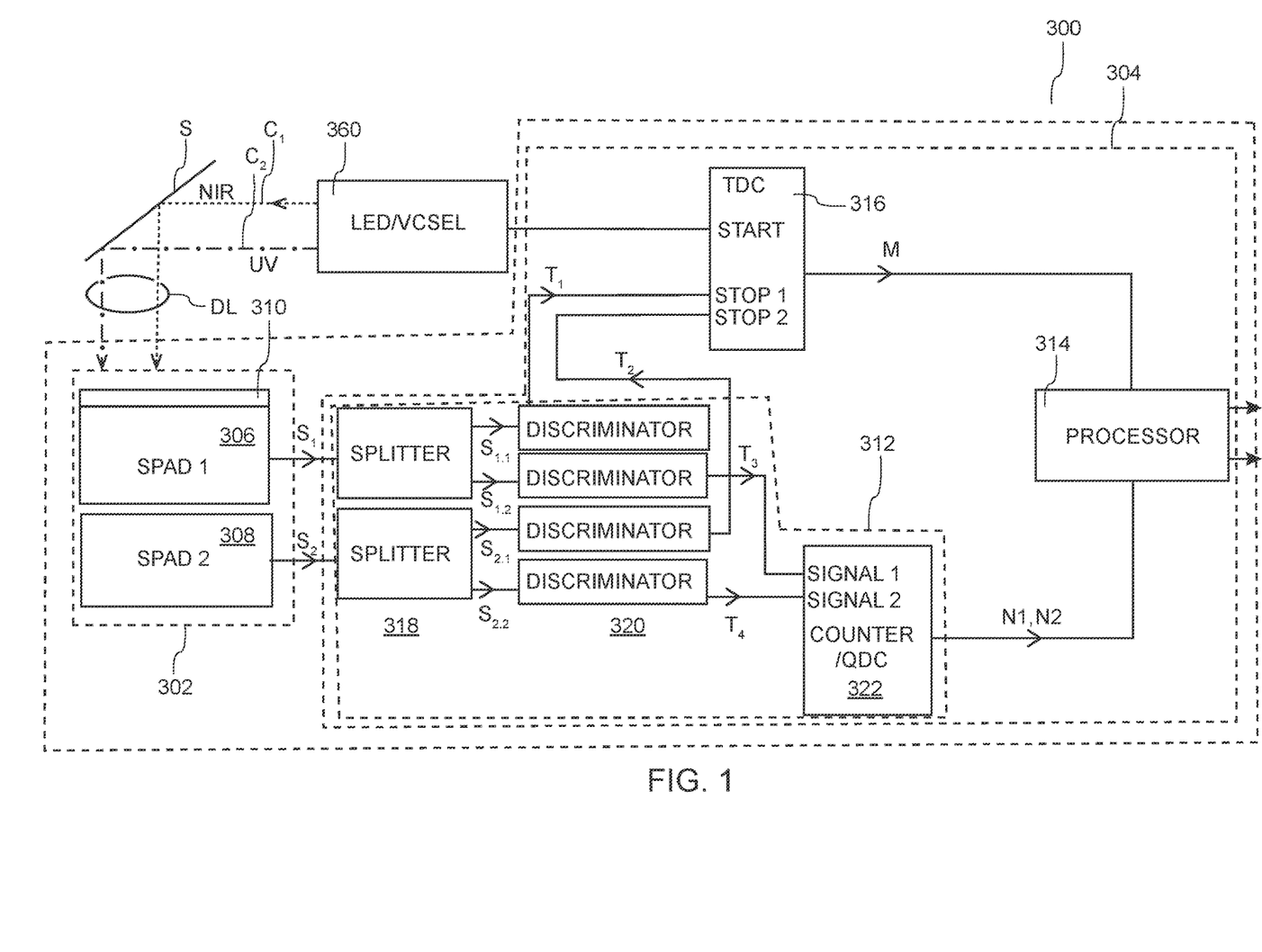
FIG. 1 is a functional block diagram of one setup of a photodetecting optoelectronic component according to the present disclosure.

FIG. 1 shows an integrated photodetecting semiconductor optoelectronic component 300 according to the present disclosure. The component 300 is delimited by the dashed polygon in FIG. 1. The component 300 may also be qualified as a photodetector. These types of photodetectors may typically be built into various electronic devices, such as smart phones and wearables.

The photodetector 300 is designed to measure the intensity of each of the two colour constituents of dichromatic light irradiating the photodetector 300. This dichromatic light DL may come from a dedicated light source 360. The light source 360 may include one or more light-emitting diodes (LEDs) and/or lasers. The one or more lasers may be of the vertical cavity surface emitting type (i.e. of the VCSEL—type).

In a preferred application, the two colour constituents C1, C2 of the dichromatic light DL, which for example comes from the light source 360, are near infrared or NIR light (C1) and near ultraviolet—blue light (C2), respectively. This might be the case, e.g. when the photodetector 300 is used for vital signs monitoring or optical spectroscopy. In such a kind of application, the dichromatic light DL from the light source 360 is shone onto the surface S of the object, which is to be analysed. The dichromatic light DL reflecting off the surface S is then detected by the photodetector 300. In FIG. 1, the first colour constituent C1 of the dichromatic light DL (e.g., near infrared or NIR) is represented by the dotted arrow. The second colour constituent C2 (e.g. blue—ultraviolet light) is represented by the dash-dotted arrow.

The photodetector 300 comprises a SPAD assembly 302, which is triggered by incoming dichromatic light DL, and electronic circuitry 304 for the readout and processing of the detection signals S1 and S2 delivered by the SPAD assembly 302.

The SPAD assembly 302 includes a first single photon avalanche diode or SPAD 306, a second single photon avalanche diode or SPAD 308 and a semiconductor optical longpass filter 310. Both SPADs 306, 308 are adapted to detect photons over a broad range of wavelengths. This means that the light sensitivity of both SPADs 306, 308 covers the spectrum from infrared via visible down to ultraviolet light. Both SPADs 306 and 308 are arranged in close proximity to each other.

In an alternative embodiment, the SPAD assembly 302 may be replaced by a SPAD array assembly. In this alternative embodiment, each SPAD 306, 308 is replaced by a SPAD array, such as a SiPM.

The semiconductor optical longpass filter 310 is associated with the first SPAD 306. It is permissive to the first one, C1, of the two colour constituents of the dichromatic light DL and blocks the second one, C2, of the two colour constituents of the dichromatic light DL.

The electronic circuitry 304 includes readout electronics 312, a microprocessor 314 and a time-to-digital converter (TDC) 316. The readout electronics 312 conditions the two detection signals S1 and S2 delivered by the SPADs 306 and 308 and then transmits the conditioned signals N1, N2 to the processor 314 for analysis. The readout electronics 312 also delivers trigger signals T1 and T2 to the TDC 316, based on the detection signals S1 and S2.

In the example shown in FIG. 1, the readout electronics 312 comprises three stages, namely a splitter stage 318, a discriminator stage 320 and a converting stage 322. The function of the splitter stage 318 is to duplicate each detection signal S1 and S2 so that they are available to both the converting stage 322 as well as the TDC 316. In FIG. 1, the splitter stage 318 includes an individual and separate splitter for each of the two SPADs 306 and 308. In line with its duplicating function, the splitter stage 318 provides four signals S1.1, S1.2, S2.1 and S2.2 to the discriminator stage 320. In the discriminator stage 320 the four signals undergo thresholding to improve the signal-to-noise ratio and prevent false detections. In FIG. 1, the discriminator stage 320 includes four individual discriminators. The discriminator stage 320 outputs four thresholded signals T1, T2, T3 and T4, two of which (T1, T2) are fed to the time-to-digital converter 316, while the other two (T3, T4) are fed to the converting stage 322.

In the converting stage 322, signals T3 and T4 are each converted into a preliminary intensity signal N1 and N2. The converting stage 322 may be implemented as a counter. In this case, the preliminary intensity signals N1, N2 correspond to the photon detection rate of each SPAD 306 and 308, i.e. how often each SPAD is triggered per unit time. If the converting stage 322 is implemented as a charge-to-digital converter (QDC), the preliminary intensity signals N1, N2 are time-integrated signals. In the following, we will assume that the conversion stage 322 is a digital counter and thus that the preliminary intensity signals N1, N2 are photon detection rates.

The time-to-digital converter (TDC) 316 is an optional element of the electronic circuitry 304. It may be present to enable the photodetector 300 for time-of-flight measurements. If the photodetector 300 is provided with a TDC 316, the latter is preferably connected to the light source 360. Light emission by the light source 360 will then start time registration by the TDC 316. Time registration may stop when the TDC 316 receives the trigger signal T1 and/or T2 from the readout electronics 312.

The processor 314 receives the photon detection rates N1, N2 from the readout electronics 312 as inputs. Optionally, it may also receive time measurements M from the TDC 316 as a further input. The processor 314 is adapted to provide a first intensity output signal I1 indicative of the intensity of the first colour constituent C1, and a second intensity output signal I2 indicative of the intensity of the second colour constituent C2 as a function of the two photon detection rates N1 and N2. I2 is determined by the processor 314 using a differential analysis, which will be explained further below.

Figure 2:
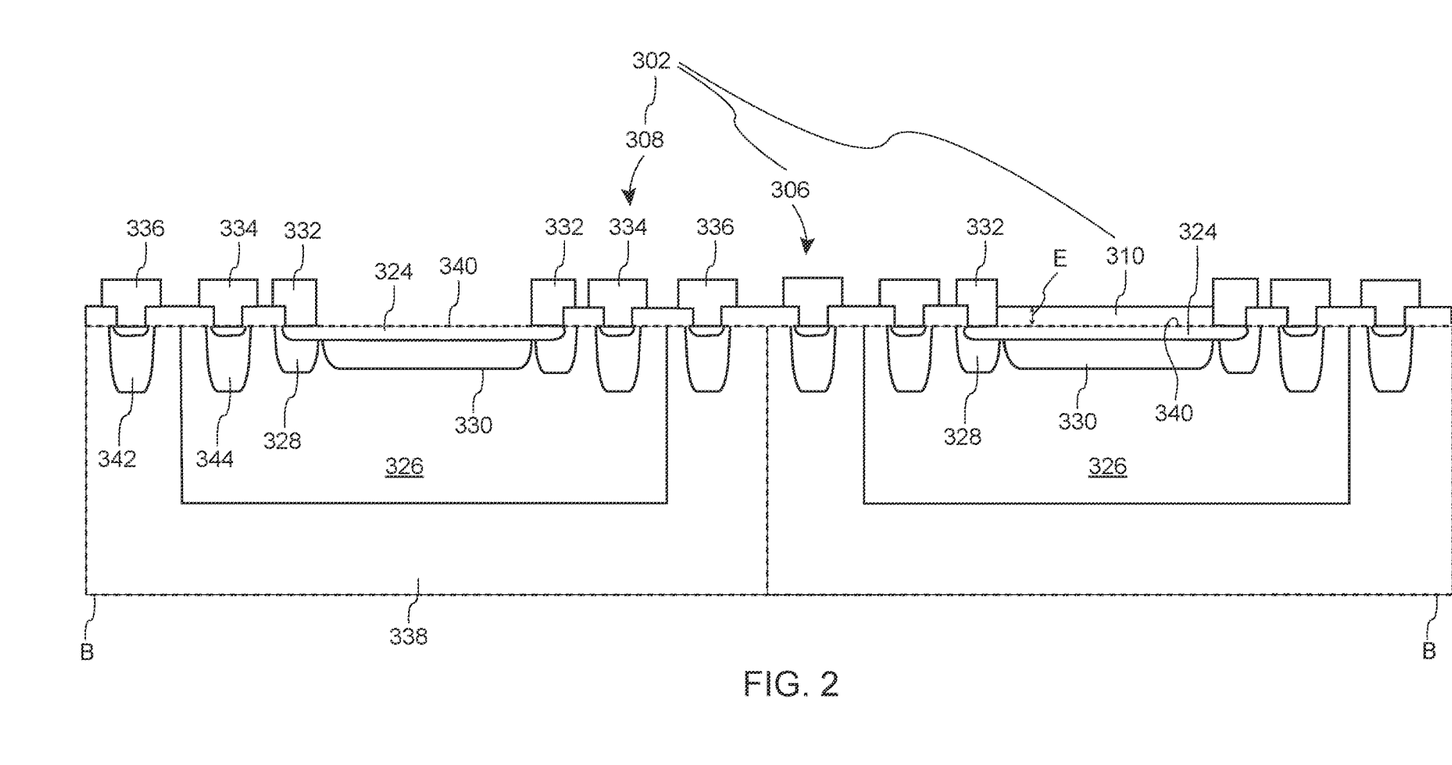
FIG. 2 is a cross-sectional view of a first embodiment of the SPAD assembly of the photodetecting optoelectronic component of FIG. 1.

We will now turn to FIG. 2, which shows a first possible embodiment of the structure of the SPAD assembly 302.

The SPAD assembly 302 shown in FIG. 2 is a monolithic structure preferably fabricated with a CMOS process. The two SPADs 306 and 308 are arranged next to each other. Both SPADs 306 and 308 are identical. This means that they have the same PN junction structure. The structure of both SPADs 306 and 308 can be of any standard design. The design shown in FIG. 2 involves a shallow p+ anode 324 in a deep N well 326. Each SPAD 306, 308 may have a guard ring 328 and/or an enrichment layer 330 to prevent premature edge breakdown. Each SPAD 306, 308 also includes an inner anode contact 332, an intermediate cathode contact 334 and an outer substrate contact 336. The substrate 338 may be of a p– type. Each SPAD 306, 308 has an active surface area 340, allowing photons to be detected to enter the SPAD. The bulk B of each SPAD 306, 308 may include local enrichment areas 342, 344 to improve the electrical current flow between the bulk B and the substrate contact 336 or the bulk B and the cathode contact 334, respectively. The dopants used in the SPADs 306 and 308 may be boron and phosphor.

In the first embodiment according to FIG. 2, the semiconductor optical longpass filter 310 completely covers the active surface area 340 of the first SPAD 306. Because of the longpass filter 310, the first SPAD 306 acts as a long wavelength sensitive sensor. In contrast thereto, the second SPAD 308 lacks a longpass filter and thus acts as a broad wavelength sensor.

The longpass filter 310 shown in FIG. 2 is a single layer of semiconductor material. This single layer is deposited directly onto the active surface area 340 of the first SPAD 306. The inner anode contact 332 surrounds the longpass filter layer 310. Preferred semiconductor materials for the longpass filter 310 are silicon, germanium, gallium arsenide or gallium nitride. A particularly preferred material for the longpass filter 310 is polycrystalline silicon since it is readily available at semiconductor fabrication plants. The cut-off wavelength, i.e. the wavelength below which the semiconductor filter 310 is opaque to electromagnetic radiation, depends on its thickness E. Accordingly, the cut-off wavelength of the longpass filter 310 can be calibrated by adjusting its thickness E. In one implementation, the longpass filter 310 may present itself as a semiconductor thin-film made of polycrystalline silicon with a thickness of around 500 nm. Such a filter has a cut-off wavelength of around 400 nm and thus blocks ultraviolet (UV) radiation.

Figures 3, 4:
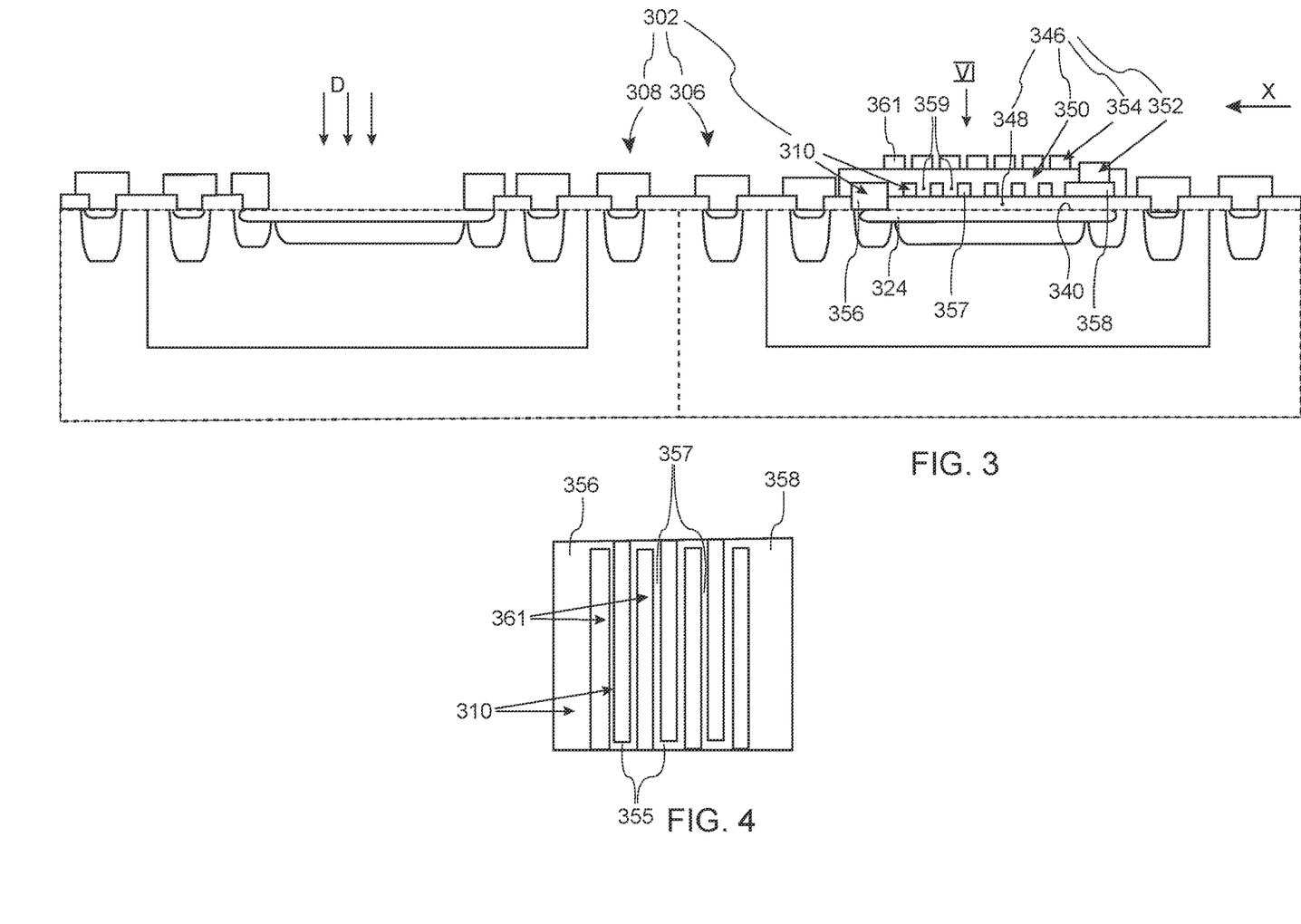
FIG. 3 is a cross-sectional view of a second embodiment of the SPAD assembly of the photodetecting optoelectronic component of FIG. 1.
FIG. 4 is a top view as indicated by the arrow VI in FIG. 3.

We will now turn to FIGS. 3 and 4, which relate to a possible second embodiment of the SPAD assembly 302. The second embodiment is in many respects similar to the first embodiment of FIG. 2. In the following, we will only describe the differences of the second embodiment with respect to the first embodiment. Regarding the similarities, reference is made to the above description.

In the second embodiment of FIG. 3, the active surface area 340 of the first SPAD 306 is covered by a resistive filter stack 346. The resistive filter stack 346 comprises five layers: a bottom dielectric layer 348, a longpass filter layer 310 covering the bottom dielectric layer 348, an intermediate dielectric layer 350 covering the longpass filter layer 310, an electric contact layer 352, and a top patterned light masking layer 354 covering the intermediate dielectric layer 350. In this embodiment, the longpass filter 310 doubles as a functional electric element that is part of an electric circuit. More precisely, the longpass filter 310 doubles as a passive quenching resistor for the first SPAD 306.

The bottom dielectric layer 348 is a field oxide layer. It acts as an electrical isolator between the resistive longpass filter 310 and the shallow extrinsic semiconductor layer 324 of the PN junction of the first SPAD 306. The resistive longpass filter 310 is located on top of the bottom dielectric layer 348.

Reference is made to FIG. 4, which is a top view as indicated by the arrow VI in FIG. 3. In the top view of FIG. 4, the intermediate dielectric layer 350 and the electric contact 352 are omitted to better show the relative arrangement of the optical mask 354 and the resistive longpass filter 310. As apparent from FIG. 4, longpass filter 310 has the shape of a meandering electrically conducting path, which forms an electric resistor. The meandering path may be a sequence of long tracks 357 and short tracks 355. The longpass filter 310 defines a set of non-filtering interstices 359 (see FIG. 3). A first end 356 of the resistive longpass filter 310 is electrically connected to the shallow extrinsic semiconductor layer 324 of the PN junction of the first SPAD 306. A second opposite end 358 of the resistive longpass filter 310 is electrically connected to the electric contact 352. Accordingly, the SPAD 306 and the resistive longpass filter 310 are connected in series.

The semiconductor material of the longpass filter 310 is doped so that the electrical material properties of the longpass filter are adapted to its additional role as a quenching resistor. The doping of the semiconductor material of the longpass filter 310 may be a p+ type doping, and the dopant may be boron.

The intermediate dielectric layer 350 covers the entire longpass filter structure 310. The intermediate dielectric layer 350 may for example be made of silicon nitride. The material of the intermediate dielectric layer 350 fills the interstices 359. The electrically isolating layer 350 is transparent to the dichromatic light DL. It also prevents short-circuits from occurring within the resistive longpass filter 310.

The electric resistor contact 352 is preferably made of metal. It may take the form of a strip filling a gap in the intermediate dielectric layer 350.

The optical mask 354 is preferably made of metal, and is opaque to the dichromatic light DL. In the embodiment shown in FIGS. 3 and 4, it consists of a set of strips 361. Each strip 361 lies straight above one of the interstices 359 (see FIG. 3). Hence, each strip 361 shields its underlying interstice 359 from the dichromatic light DL. In this way, the whole set of interstices 359 is covered by the set of strips 361, which form the optical mask. The set of masking strips 361 has an offset with respect to the set of long tracks 357 of the resistive longpass filter 310 in a direction X transverse to the main direction of light entry D into the SPAD assembly 302.

An effect of the resistive filter stack 346 is that the impinging dichromatic light DL can only reach those regions of the active surface area 340 of the first SPAD 306, which are covered by long tracks 357 of the longpass filter 310. More exactly, only the first colour constituent C1 of the dichromatic light DL can reach said regions since the set of long tracks 357 absorbs the second constituent C2 of the dichromatic light DL. Accordingly, only the first colour constituent C1 is detected by the PN junction of the first SPAD 306.

The processor 314 preferably operates as follows in order to generate the first intensity output signal I1 and the second intensity output signal I2:

The processor 314 obtains the first photon detection rate N1 from the counter 322. It then divides this signal by the predetermined and known photon detection efficiency of the first SPAD 306 at the wavelength of the first colour constituent C1. The result is the first intensity output signal I1.

The differential analysis to work out the second intensity output signal I2 includes the following steps:

The processor 314 first obtains the first photon detection rate N1 and the second photon detection rate N2 from the counter 322.

Then, it calculates the second intensity output signal I2 with the following formula:

$$I2 = a \times N2 - b \times N1$$

In this equation, a and b are constants, which are predetermined by the photon detection efficiencies of the first and second SPAD 306, 308 at the wavelengths corresponding to the two colour constituents C1 and C2.

FIGS. 5 to 10 show an exemplary method of forming the resistive filter stack 346 on the top surface of the first SPAD 306.

Figure 5:
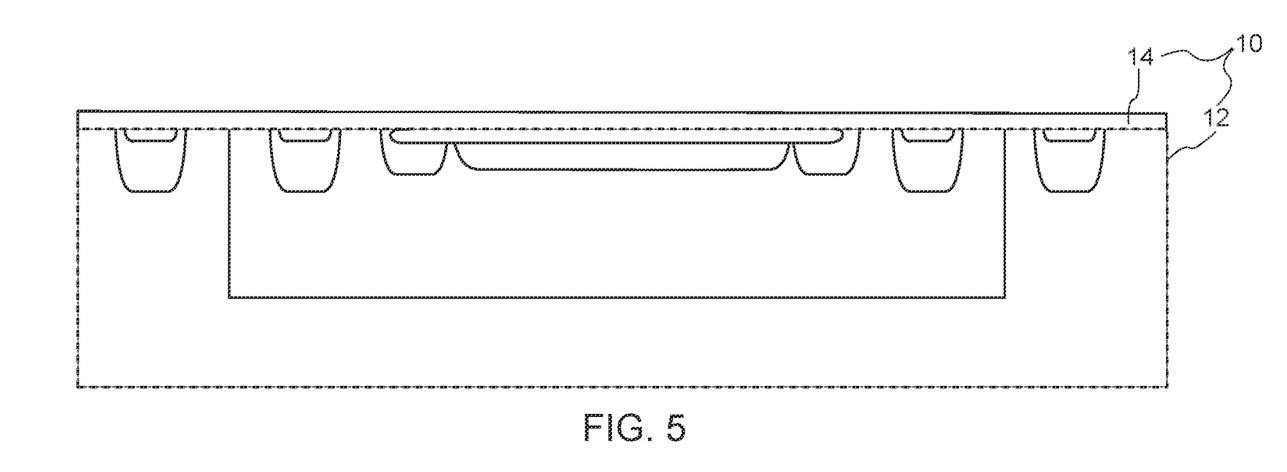
FIGS. 5 to 10 show the different steps of a process of forming the resistive filter stack of the second embodiment of FIG. 3.

The method starts at FIG. 5. The basic SPAD structure (identified by the reference number 10), realised by implantation, annealing and etching processes, is already present. It includes a bulk 12 and a field oxide layer 14 covering the bulk 12.

In one embodiment, the single field oxide layer 14 may be replaced by a layer stack comprising several oxide and metal layers, preferably formed with a CMOS process.

Figure 6:
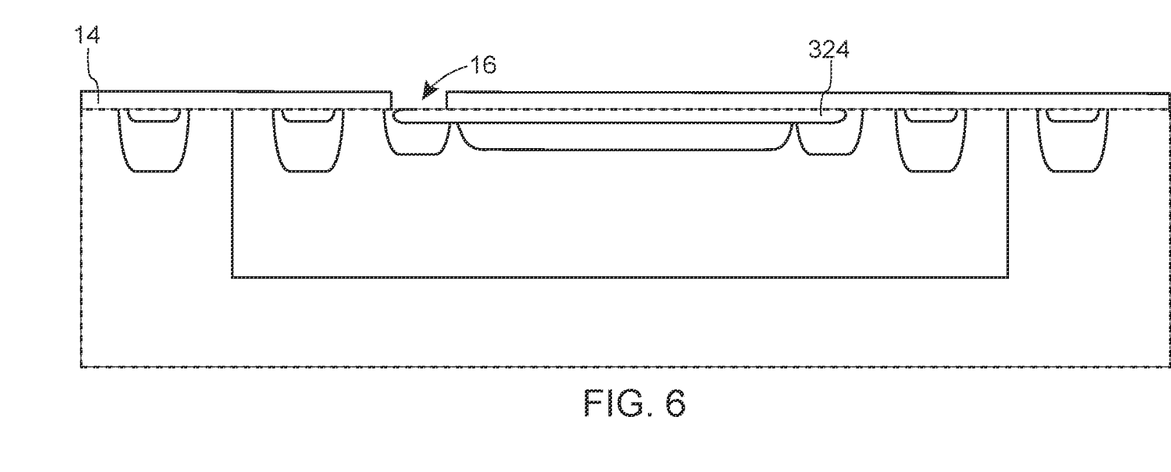

The first step is to etch a clearance 16 into the field oxide layer 14 to lay bare a section of the shallow extrinsic semiconductor layer 324. The result of this first step is shown in FIG. 6.

Figure 7:
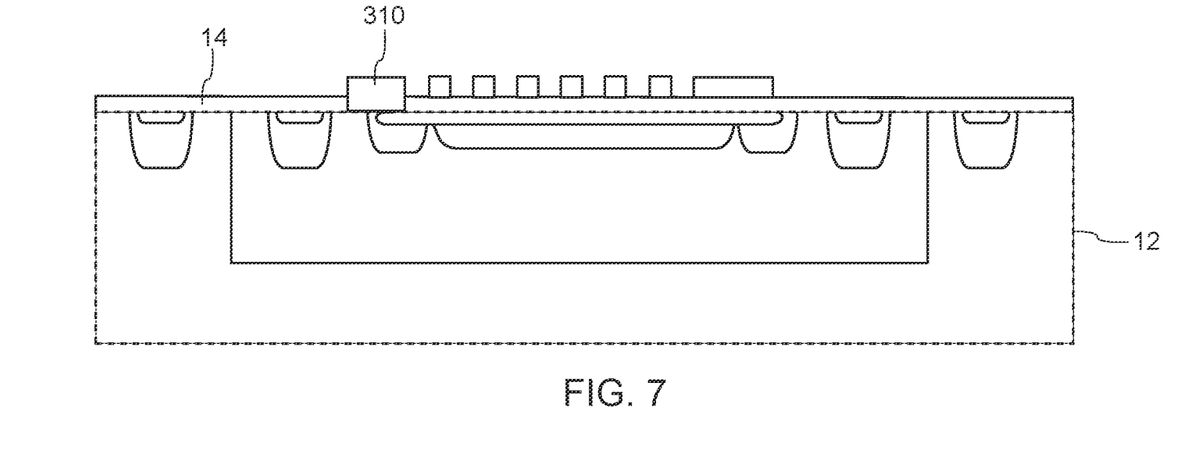

The next step is to form the resistive longpass filter 310. This is done by, first, the deposition of a polycrystalline silicon layer. This layer is then patterned to obtain an interdigitated stripe geometry. The result is shown in FIG. 7.

Figure 8:
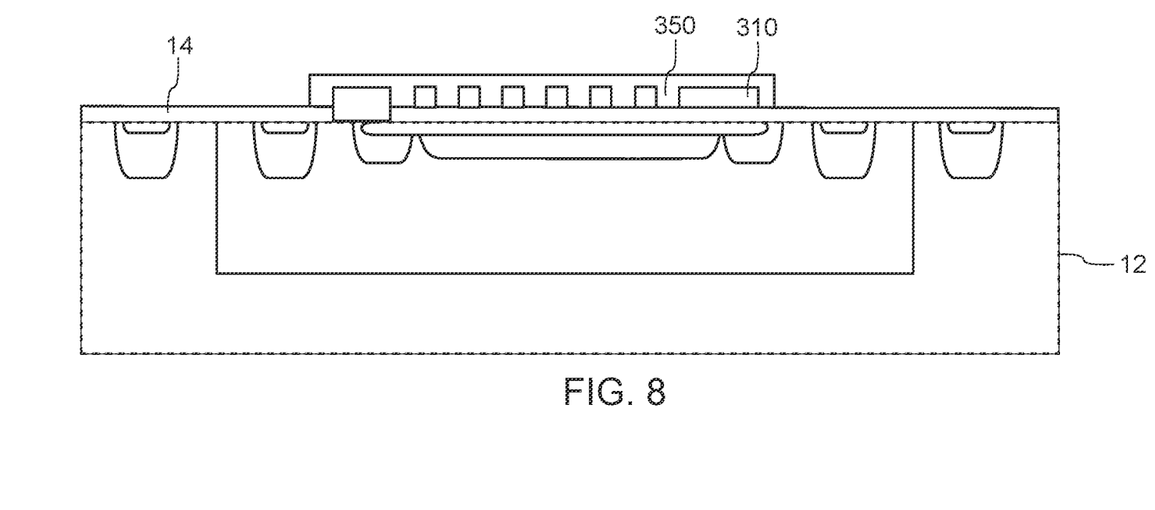

This is followed by the deposition of the transparent intermediate dielectric layer 350, the result of which is shown in FIG. 8.

Figure 9:
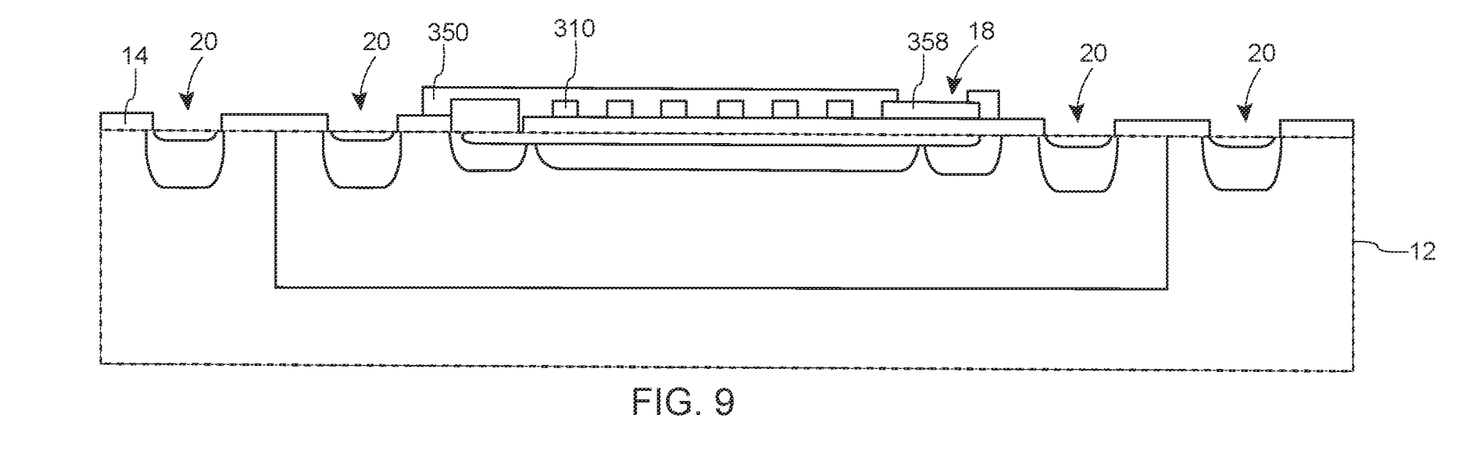

The next step is an etching step, which creates a clearance 18 in the intermediate dielectric layer 350. This clearance 18 uncovers the second end 358 of the longpass filter 310. Concurrently, further clearances 20 are etched into the field oxide layer 14 to provide access to the enrichment layers in the bulk 12. The result of this step is shown in FIG. 9.

Figure 10:
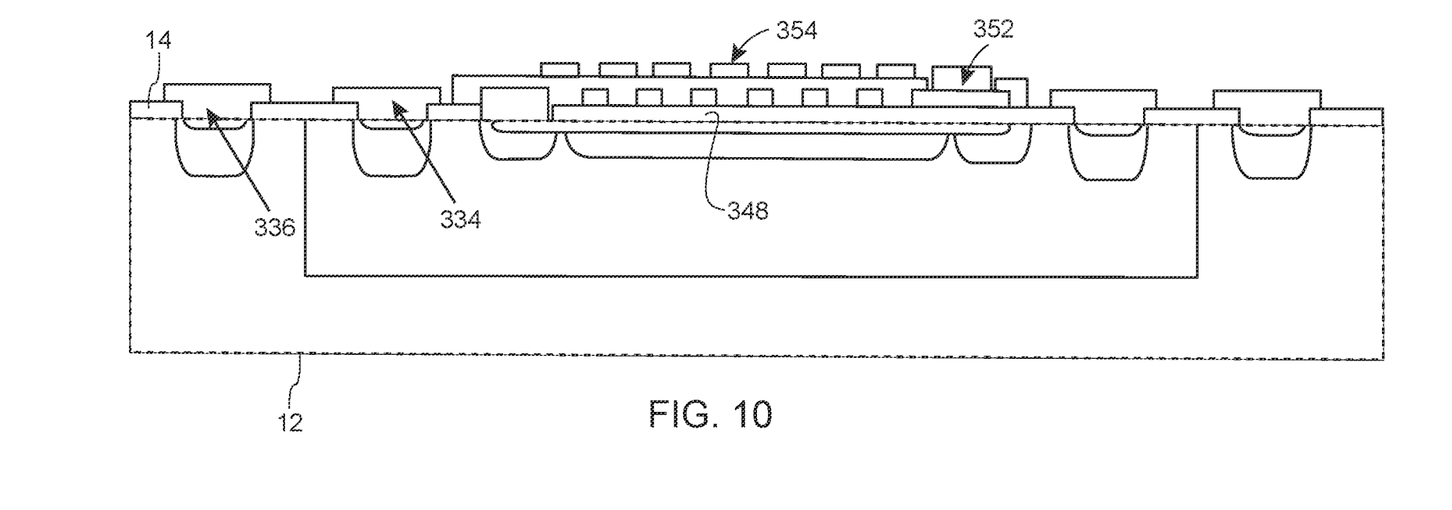

The final step is a metallisation step. Metal (for example, aluminium) is deposited on selected areas to obtain the cathode contact 334, the substrate contact 336, the resistor contact 352 and the set of masking strips 354. The result is shown in FIG. 10.

In one embodiment, the metal layer 334, 336, 352 and 354 may be covered by a dielectric passivation layer (e.g. an oxide layer).

In a further embodiment, the integrated photodetecting semiconductor optoelectronic component of the present disclosure may comprise one or more additional SPADs with one or more corresponding additional semiconductor optical longpass filters for measuring the intensity of one or more additional colour constituents of incident light. The additional longpass filters may have increasing cutoff wavelengths. This may be achieved by using absorbing layers of different thickness. The differential analysis may then be extended accordingly. Likewise, one would then also add one or more readout channels to the electronic circuitry.

The integrated photodetecting semiconductor optoelectronic components of the present disclosure have in particular the following technical advantages:

they can simultaneously detect light signals in two different wavelength intervals with fast timing response, intrinsic amplification and very high accuracy, down to single photon level;

they can accurately detect blue and ultraviolet light without an expensive shortpass filter such as a Bragg filter;

their fabrication is compatible with CMOS processing, which reduces costs;

in the variant where the longpass filter doubles as a functional electric element, they have a particularly high geometrical fill factor and are easy to fabricate.

The invention claimed is:

1. An integrated photodetecting semiconductor optoelectronic component for measuring the intensity of each of the two colour constituents of dichromatic light irradiating the optoelectronic component, the component comprising:

a first SPAD adapted to detect photons over a broad range of wavelengths, the first SPAD comprising an active surface area allowing photons to be detected to enter the first SPAD;

a second SPAD adapted to detect photons over a broad range of wavelengths, the second SPAD being arranged next to the first SPAD;

a semiconductor optical longpass filter that at least partially covers the active surface area of the first SPAD, the longpass filter being permissive to a first one of the two colour constituents of the dichromatic light and blocking the second one of the two colour constituents of the dichromatic light; and electronic circuitry for the readout and processing of detection signals delivered by the first and second SPAD, the electronic circuitry being adapted to provide:

i) a first intensity output signal I1 indicative of the intensity of the first colour constituent, based on the detection signal delivered by the first SPAD; and ii) a second intensity output signal I2 indicative of the intensity of the second colour constituent, via a differential analysis based on the detection signals delivered by the first and second SPAD, wherein the differential analysis carried out by the electronic circuitry to provide the second intensity output signal I2 comprises the steps of:

determining a first photon detection rate N1 from the output signal delivered by the first SPAD;

determining a second photon detection rate N2 from the output signal delivered by the second SPAD; and calculating the second intensity output signal I2 with the following formula:

$$I2 = a \times N2 - b \times N1$$

wherein a and b are constants, which are predetermined by the photon detection efficiencies of the first and second SPAD at the wavelengths corresponding to the two colour constituents.

2. The component of claim 1, wherein the longpass filter is a single layer of semiconductor material deposited above the active surface area of the first SPAD.

3. The component of claim 1, wherein the semiconductor material of the longpass filter is silicon, germanium, gallium arsenide or gallium nitride.

4. The component of claim 1, wherein the longpass filter doubles as a functional electric element that is part of an electric circuit.

5. The component of claim 4, wherein the semiconductor material of the longpass filter is doped so that the electrical material properties of the longpass filter are adapted to its additional role as said functional electric element.

6. The component of claim 4, wherein the longpass filter doubles as a passive quenching resistor for the first SPAD.

7. The component of claim 6, wherein the longpass filter has the shape of a meandering electrically conducting path that forms said passive quenching resistor.

8. The component of claim 7, wherein the meandering shape of the longpass filter defines a set of non-filtering interstices, and wherein said interstices are covered by an optical mask, preferably made of metal, which is opaque to the dichromatic light.

9. The component of claim 1, wherein the electronic circuitry includes a time-to-digital converter for time-of-flight measurements.

10. The component of claim 1, wherein the first SPAD and the second SPAD have the same p-n-junction structure.

11. The component of claim 1, wherein the two colour constituents of the dichromatic light are near infrared light and near ultraviolet-blue light, respectively.

12. The component of claim 1, further comprising one or more additional SPADs with one or more corresponding additional semiconductor optical longpass filters for measuring the intensity of one or more additional colour constituents of incident light.

* * * * *